US009390492B2

(12) United States Patent
Rotem

(10) Patent No.: US 9,390,492 B2
(45) Date of Patent: Jul. 12, 2016

(54) METHOD AND SYSTEM FOR REFERENCE-BASED OVERLAY MEASUREMENT

(71) Applicant: KLA-Tencor Corporation, Milpitas, CA (US)

(72) Inventor: Efrat Rotem, Haifa (IL)

(73) Assignee: KLA-Tencor Corporation, Milpitas, CA (US)

( * ) Notice: Subject to any disclaimer, the term of this patent is extended or adjusted under 35 U.S.C. 154(b) by 241 days.

(21) Appl. No.: 13/803,621

(22) Filed: Mar. 14, 2013

(65) Prior Publication Data
US 2014/0270469 A1    Sep. 18, 2014

(51) Int. Cl.
G06T 7/00    (2006.01)
G03F 7/20    (2006.01)

(52) U.S. Cl.
CPC ............ *G06T 7/001* (2013.01); *G03F 7/70633* (2013.01); *G06T 2207/30148* (2013.01)

(58) Field of Classification Search
None
See application file for complete search history.

(56) References Cited

U.S. PATENT DOCUMENTS

| 7,598,006 | B1 | 10/2009 | Smith et al. |
| 2003/0223630 | A1 | 12/2003 | Adel et al. |
| 2004/0049762 | A1 | 3/2004 | Peng et al. |
| 2005/0117796 | A1* | 6/2005 | Matsui et al. ................. 382/145 |
| 2005/0250025 | A1 | 11/2005 | Yamaguchi |
| 2010/0208935 | A1* | 8/2010 | Arnz et al. .................... 382/100 |
| 2011/0202298 | A1* | 8/2011 | Izikson et al. .................. 702/83 |

FOREIGN PATENT DOCUMENTS

KR    1020070033106 A    3/2007

* cited by examiner

*Primary Examiner* — Jon Chang
(74) *Attorney, Agent, or Firm* — Suiter Swantz pc llo

(57) ABSTRACT

The present invention may include acquiring a plurality of reference measurement images from a plurality of reference overlay target sites of a wafer via a reference image sampling process, wherein the reference image sampling process includes acquiring one or more images at each of a plurality of reference overlay target sites of the at least one wafer, generating a reference image by combining the plurality of reference measurement images acquired from the plurality of reference overlay target sites of the wafer of the reference image sampling process; acquiring one or more measurement images from an overlay target site of the wafer via a measurement image sampling process and measuring a virtual overlay of the one or more measurement images by comparing the one or more measurement images acquired from the overlay target site of the wafer to the generated reference image.

24 Claims, 4 Drawing Sheets

METHOD AND SYSTEM FOR REFERENCE-BASED OVERLAY MEASUREMENT

TECHNICAL FIELD

The present invention generally relates to overlay metrology measurements performed at one or more overlay targets across a substrate surface, and, in particular, to a method and system for performing reference-based overlay metrology at one or more overlay targets of a semiconductor wafer surface.

BACKGROUND

As the dimensions of semiconductor devices and components continue to decrease, the need for increased alignment control between various layers or features within a single layer of a given sample will continue to increase. In the context of semiconductor processing, semiconductor-based devices may be produced by fabricating a series of layers on a substrate, some or all of the layers including various structures. The relative position of these structures both within a single layer and with respect to structures in other layers is critical to the performance of the devices. Examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error.

An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). If the layers or patterns of a given semiconductor device are not properly formed, then the structure on one layer or pattern tends to be offset or misaligned relative to the structure on the other layer or pattern. The misalignment between any of the patterns used at different stages of semiconductor integrated circuit manufacturing is known as 'overlay error.'

Moreover, if a measured characteristic, such as overlay error, of the wafer is unacceptable (e.g., out of a predetermined range for the characteristic), the measurement of the one or more characteristics may be used to alter one or more parameters of the process such that additional wafers manufactured by the process have acceptable characteristics.

In the case of overlay error, an overlay measurement may be used to correct a lithography process in order to keep overlay errors within desired limits. For example, overlay measurements may be fed into an analysis routine that calculates "correctables" and other statistics, which may be used by the operator in order to better align the lithography tool used in the wafer processing.

Accordingly, it may be desirable to provide a method and system providing overlay measurement capabilities that improve upon the currently utilized methods.

SUMMARY

A method for performing reference-based overlay metrology using a virtual measurement image is disclosed. In one aspect, the method may include, but is not limited to, acquiring a plurality of reference measurement images from a plurality of reference overlay target sites of a wafer via a reference image sampling process, wherein the reference image sampling process includes acquiring one or more images at each of a plurality of reference overlay target sites of the at least one wafer; generating a reference image by combining the plurality of reference measurement images acquired from the plurality of reference overlay target sites of the wafer of the reference image sampling process; acquiring one or more measurement images from an overlay target site of the wafer via a measurement image sampling process; and measuring a virtual overlay of the one or more measurement images by comparing the one or more measurement images acquired from the overlay target site of the wafer to the generated reference image. In a further aspect, the method may include calculating overlay associated with an overlay target site utilizing the measured virtual overlay of the one or more measurement images.

A system for performing reference-based overlay metrology using a virtual measurement image is disclosed. In one aspect, the system may include, but is not limited to, one or more overlay metrology systems configured to acquire a plurality of reference measurement images from a plurality of reference overlay target sites of a wafer via a reference image sampling process, wherein the reference image sampling process includes acquiring one or more images at each of a plurality of reference overlay target sites of the at least one wafer; one or more computing systems including one or more processors; a computer readable medium storing instructions executable by the one or more processors of the computing system and configured to cause the one or more processors to: generate a reference image by combining the plurality of reference measurement images acquired from the plurality of reference overlay target sites of the wafer of the reference image sampling process; acquire one or more measurement images from an overlay target site of the wafer via a measurement image sampling process; and measure a virtual overlay of the one or more measurement images by comparing the one or more measurement images acquired from the overlay target site of the wafer to the generated reference image. In a further aspect, the system is configured to calculated overlay associated with an overlay target site utilizing the measured virtual overlay of the one or more measurement images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Figure 1A:
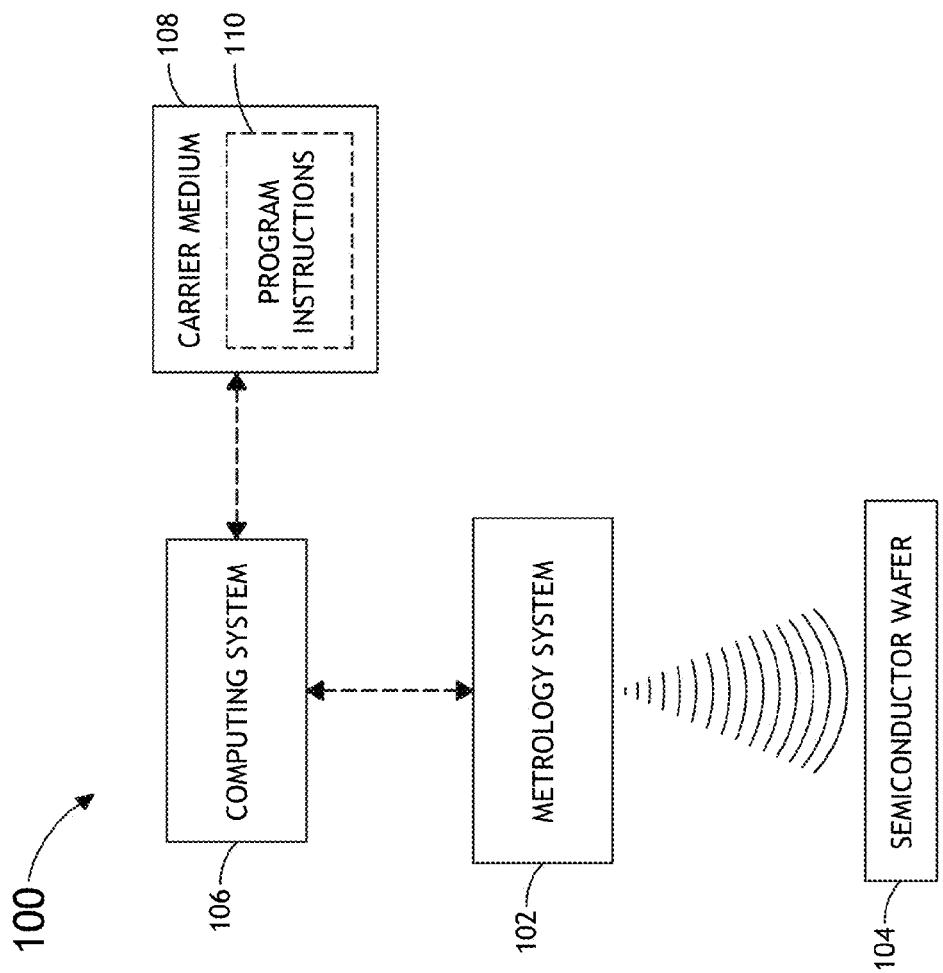
FIG. 1A is a block diagram illustrating a system for performing reference-based overlay metrology using a virtual measurement image, in accordance with one embodiment of the present invention.
Figure 1C:
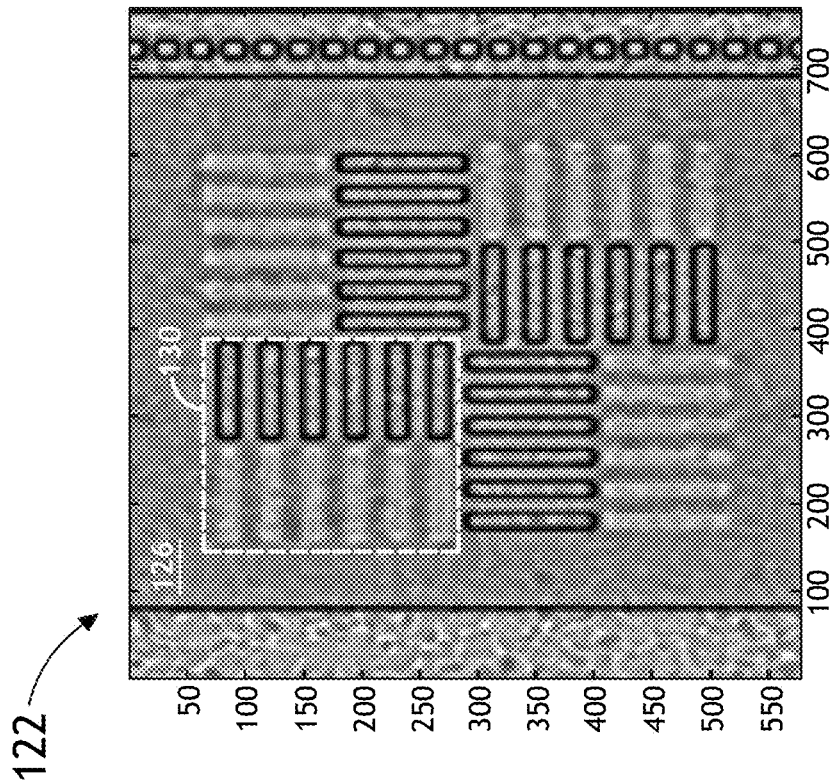
FIG. 1C illustrates a top plan view of a measurement image of a measured overlay target, in accordance with one embodiment of the present invention.
Figure 1B:
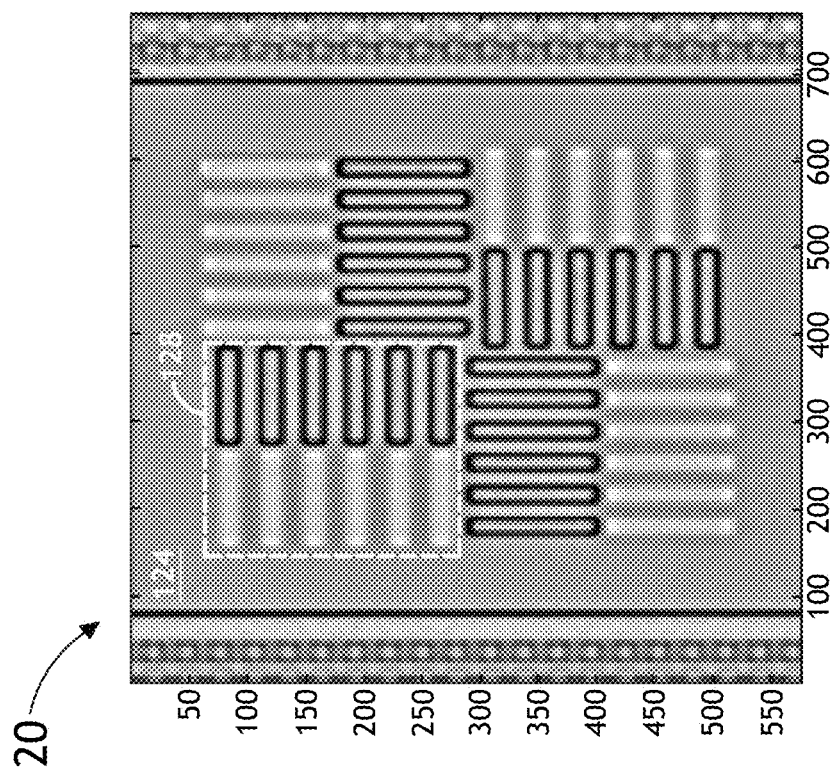
FIG. 1B illustrates a top plan view of a reference image of a virtual overlay target, in accordance with one embodiment of the present invention.
Figure 1E:
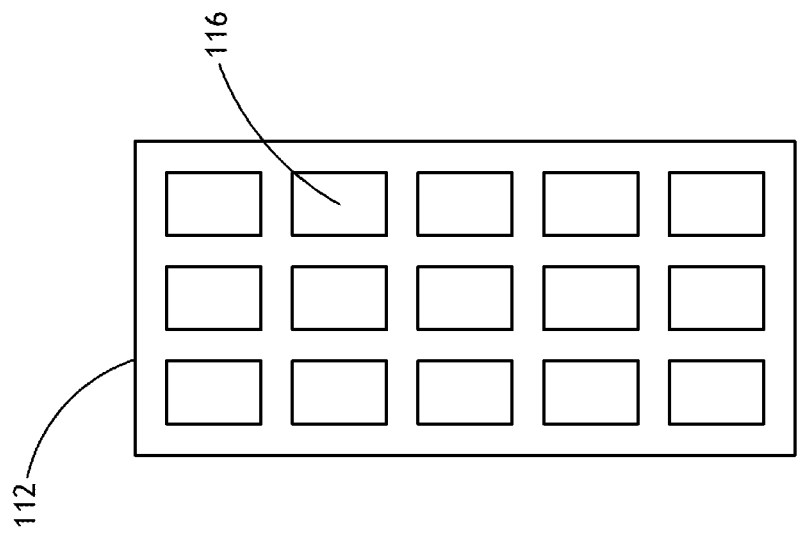
FIG. 1E illustrates a top plan view of an individual field of a semiconductor wafer showing a plurality of targets within the field.
Figure 1D:
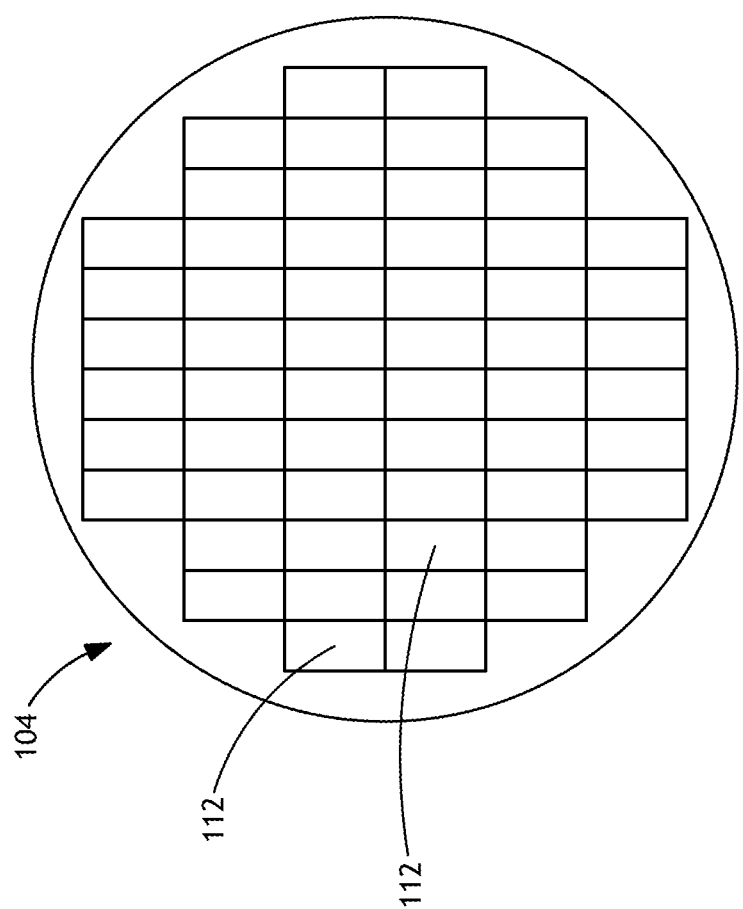
FIG. 1D illustrates a top plan view of a semiconductor wafer with demarked fields.
Figure 2:
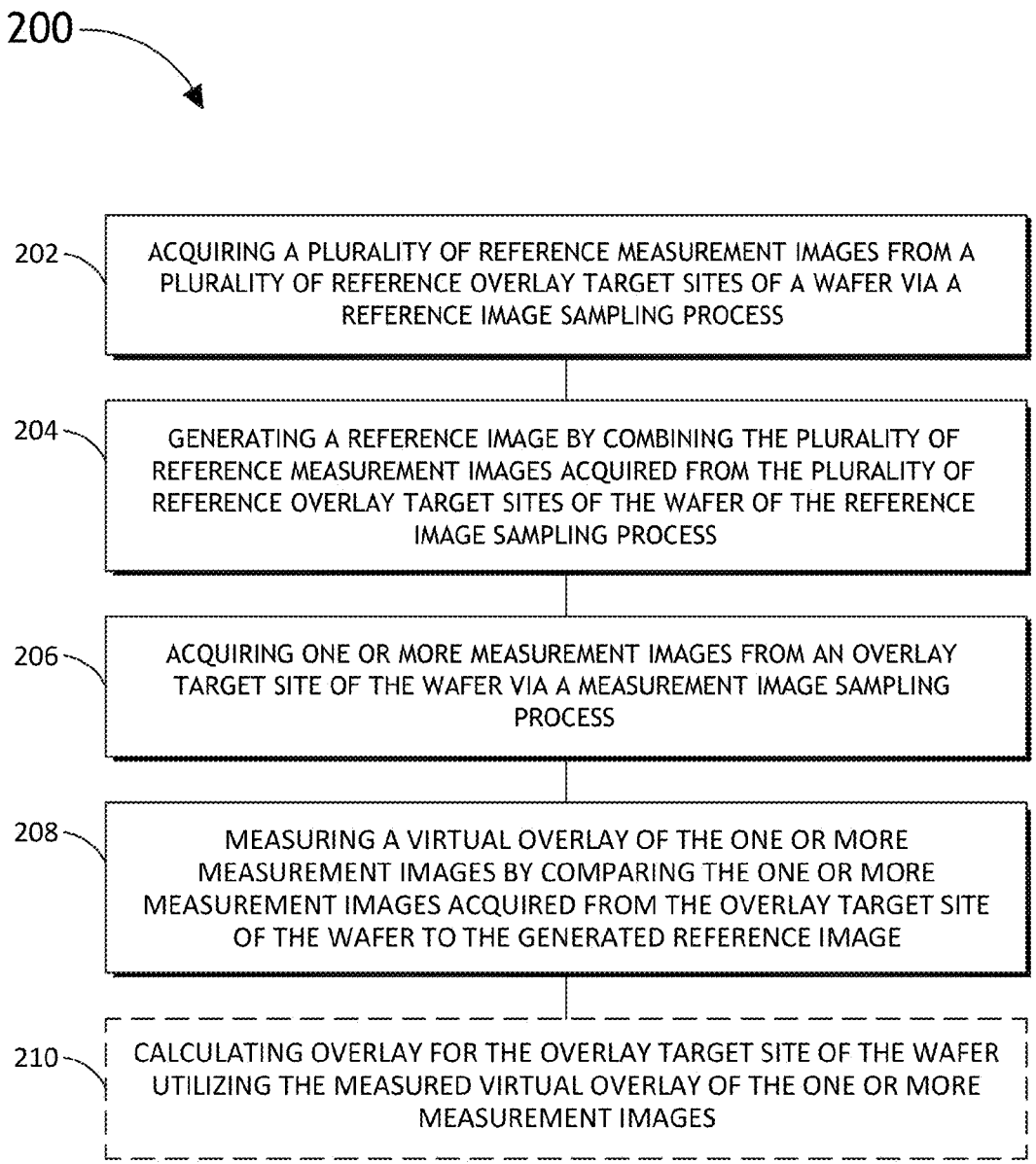
FIG. 2 is a flow diagram illustrating a method for performing reference-based overlay metrology using a virtual measurement image, in accordance with one embodiment of the present invention.

Referring generally to FIGS. 1A through 2, a method and system for performing reference-based overlay metrology using a virtual measurement image is described in accordance with the present disclosure.

As used throughout the present disclosure, the term "wafer" generally refers to a substrate formed of a semiconductor or non-semiconductor material. For example, a semiconductor or non-semiconductor material may include, but is not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple dies. A die is the functional unit which eventually becomes a single chip. On product wafers, overlay metrology marks are typically placed in the scribeline area (for example in the 4 corners of the field). This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry. Engineering and characterization wafers (not production wafers), however, typically have many overlay targets throughout the center of the field where no such limitations are involved. Because of the spatial separation between the "scribe-line" metrology marks and the prime die circuitry, there occur discrepancies between what is measured and what needs to be optimized on product wafers. Advances in both the scribe-line metrology marks and in their interpretation are required.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

FIG. 1A illustrates a system 100 for performing reference-based overlay metrology using a virtual measurement image, in accordance with one embodiment of the present invention. In one aspect of the present invention, the system 100 may include a metrology system 102, such as a metrology system configured to perform overlay metrology at identified locations of the semiconductor wafer. The metrology system 102 may include any appropriate metrology system known in the art. In an additional aspect of the present invention, the system 100 may include a computing system 106 equipped with one or more processors. The computer system 106 may further be in communication with a carrier medium 108 (e.g., non-transitory storage medium (i.e., memory medium)) containing program instructions 110 configured to cause the one or more processors of the computing system 106 to carry out the various steps described through the present disclosure.

In one aspect of the present invention, the one or more processors of the computing system 106 are configured to: receive a plurality of reference measurement images from acquired from a plurality of reference overlay target sites of the wafer 104 from the metrology system 102; generate a reference image (e.g., image 120 of FIG. 1B) by combining the plurality of reference measurement images acquired from the plurality of reference overlay target sites of the wafer 104 of the reference image sampling process; acquire one or more measurement images (e.g., image 122 of FIG. 1C) from an overlay target site (e.g., site 126 of FIG. 1C) of the wafer 104 via a measurement image sampling process; and measure a virtual overlay of the one or more measurement images 122 by comparing the one or more measurement images 122 acquired from the overlay target site 126 of the wafer 104 to the generated reference image 120. In a further aspect, the one or more processors of the computing system 106 are configured to calculate overlay for the overlay target site of the measured image using the measured virtual overlay.

In a further embodiment, the metrology system 102 may be configured to accept instructions from another subsystem of the system 100 in order to carry out a designated measurement sampling plan. For instance, the metrology system 102 may accept instructions from one or more computing systems 106 of the system 100. Upon receiving the instructions from the computing system 106, the metrology system 102 may acquire measurement imager data at various locations of the semiconductor wafer 104 identified in the provided instructions.

It should be recognized that the various steps described throughout the present disclosure may be carried out by a single computing system 106 or, alternatively, a multiple computing system 106. Moreover, different subsystems of the system 200, such as the metrology system 102, may include a computer system suitable for carrying out at least a portion of the steps described above. Therefore, the above description should not be interpreted as a limitation on the present invention but merely an illustration. Further, the one or more computer systems 106 may be configured to perform any other step(s) of any of the method embodiments described herein.

In another embodiment, the computing system 106 may be communicatively coupled to the metrology system 102 or another process tool in any manner known in the art. For example, the one or more computer systems 106 may be coupled to a computer system of a metrology system 102

(e.g., computer system of a metrology system 102) or to a computer system of a process tool. In another example, the metrology system 102 and another process tool may be controlled by a single computer system. In this manner, the computer system 106 of the system 100 may be coupled to a single metrology-process tool computer system. Moreover, the computer system 106 of the system 100 may be configured to receive and/or acquire data or information from other systems (e.g., inspection results from an inspection system, metrology results from a metrology system, or process tool correctables calculated from a system, such as KLA-Tencors KT Analyzer) by a transmission medium that may include wireline and/or wireless portions. In this manner, the transmission medium may serve as a data link between the computer system 106 and other subsystems of the system 100. Moreover, the computer system 106 may send data to external systems via a transmission medium. For instance, the computer system 106 may send a generated sub-sampling scheme or set of process tool correctables to a separate metrology system, which exists independently of the described system 100.

The computer system 106 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium Program instructions 110 implementing methods such as those described herein may be transmitted over or stored on carrier medium 108. The carrier medium 108 may be a transmission medium such as a wire, cable, or wireless transmission link. The carrier medium may also include a storage medium such as a read-only memory, a random access memory, a magnetic or optical disk, or a magnetic tape.

The embodiments of the system 100 illustrated in FIG. 1A may be further configured as described herein. In addition, the system 100 may be configured to perform any other step(s) of any of the method embodiment(s) described herein.

FIG. 2 is a flow diagram illustrating steps performed in a method for performing reference-based overlay metrology using a virtual measurement image. In one aspect, it is recognized that data processing steps of the process flow 200 may be carried out via a pre-programmed algorithm executed by one or more processors of computing system 106. It should, however, be recognized by those skilled in the art, that the system 100 should not be interpreted as a limitation on process 200 as it is contemplated that a variety of system configurations may carry out process flow 200.

In a first step 202, a plurality of reference measurement images from a plurality of reference overlay target sites of a wafer may be acquired via a reference image sampling process. In this regard, the reference image sampling process may include acquiring one or more images at each of a plurality of reference overlay target sites of the at least one wafer 104.

In one embodiment, the reference image sampling process of method 200 may be carried out utilizing an overlay metrology tool 102. In this regard, each of the plurality of reference measurement images acquired from the reference overlay target sites of the wafer 104 may be acquired utilizing an overlay metrology tool 102. It is noted herein that the reference measurement images may be acquired utilizing any overlay metrology tool known in the art.

As shown in FIG. 1D, in one embodiment, the available reference image measurement spots include all fields 112 on one or more wafers 104. For example, as shown in FIG. 1D, wafer 104 has multiple fields 112 formed thereon. Although a particular number and arrangement of fields 112 on wafer 104 are shown in FIG. 1D, the number and arrangement of fields on the wafer may vary depending on, for example, the device being formed on the wafers. The reference image measurements of step 202 may be performed at any sub-set of the fields 112 formed on wafer 104 and or any sub-set of fields on other wafers in at least one lot. For example, the measurements may be performed a selected number (N) of fields formed on all of the wafers in at least one lot. The measurements may be performed on device structures formed in the fields and/or on test structures formed in the fields.

In another embodiment, the reference image measurement spots measured in a reference image sampling process may include a sub-set of the targets formed on one or more wafers in at least one lot. For example, as shown in FIG. 1E, field 112 formed on a wafer 104 may include targets 116. Although a particular number and arrangement of targets 116 in field 112 are shown in FIG. 1E, the number and arrangement of targets 116 in the fields 112 may vary depending on, for example, the devices formed on the wafer 104. Targets 116 may include device structures and/or test structures. In this embodiment, therefore, the measurements may be performed on a selected sub-set of targets 116 formed in a selected sub-set of fields 112. It should be recognized by those skilled in the art that the targets 116 and the fields 112 of FIGS. 1D and 1E are not depicted to scale, as the fields and targets are enlarged relative to the wafer 104 for purposes of clarification.

In one aspect, the plurality of reference overlay target sites may consist of a sub-set of the available overlay target sites 116 distributed across the wafer 104. In one embodiment, the number of sampled overlay target sites in the reference image sampling is selectable by a user. In this regard, a user may select the number of overlay target sites that should be sampled in order to generate the reference image 120. In another embodiment, the location of the sampled overlay target sites in the reference image sampling is selectable by a user. In this regard, a user may select the positions of overlay target sites that should be sampled in order to generate the reference image 120 of the virtual target 124. In another embodiment, the number of sampling locations to be sampled in a sampling process may be preselected to reside within a range. For example, a user may select the minimum and/or maximum number of sampling locations to be sampled.

In another embodiment, the number and/or location of sampled overlay target sites of the reference image sampling process may be selected randomly. In a further embodiment, the number of the sampling locations may be preselected by a user, whereas the position of those sampling locations may be selected randomly (e.g., selected via a Monte Carlo simulation process).

In a second step 204, a reference image 120 may be generated by combining the plurality of reference measurement images acquired from the plurality of reference overlay target sites of the wafer 104 of the reference image sampling process. In this regard, the reference imagery results obtained from each of the measurement locations of the reference image sampling process may be combined to form a single aggregated reference image 120. It is noted herein that the multiple reference measurement images may be combined in any manner known in the art to form the aggregated reference image 120.

In one embodiment, the aggregated reference image 120 may be generated by summing the plurality of reference measurement images acquired from the plurality of reference overlay target sites of the wafer 104 of the reference image sampling process. In this regard, the system 100 may act to digitally sum the pixel values associated with each of the reference measurement images of a reference image sampling process into a single reference image 120.

In one embodiment, the aggregated reference image 120 may be generated by averaging the plurality of reference measurement images acquired from the plurality of reference overlay target sites of the wafer 104 of the reference image sampling process. In this regard, the system 100 may average the pixel values associated with each of the reference measurement images of a reference image sampling process, thereby generating a single "averaged" reference image 120. In a further embodiment, the aggregated reference image 120 may be generated by applying a weighted averaging function to the plurality of reference measurement images acquired from the plurality of reference overlay target sites of the wafer 104 of the reference image sampling process.

In another embodiment, a reference measure image alignment process may be carried out prior to combining the reference measurement images. In this regard, two or more reference measurement images acquired from the plurality of reference overlay target sites of the wafer may be aligned utilizing any image alignment procedure known in the art. Upon alignment of two or more reference measurement images, the reference measurement images may be combined.

In a further aspect, the aggregated reference image 120 may be generated during a train process. In this regard, a sequence of reference image acquisitions may be carried out in order to collect reference measurement images from multiple wafer sites of the wafer 104. In turn, the system 100 may process the collected reference image measurements to generate a reference image 120. Further, the generated reference image 120 may be stored in memory medium 108 for later use.

In a third step 206, one or more measurement images 122 from an overlay target site 126 of the wafer may be acquired via a measurement image sampling process. In this regard, upon forming the reference image 120 of a virtual target 124 of step 204, the system 100 may then acquire imagery data from one or more overlay targets 126 of the wafer 104 via a measurement image sampling process. It is noted herein that the targets included in the measurement image sampling process need not be the same as the overlay targets sampled during the reference image sampling process.

In one embodiment, the measurement image sampling process of method 200 may be carried out utilizing the overlay metrology tool 102. In this regard, the metrology tool 102 of the system 100 may obtain one or more measurement images, such as image 122 of FIG. 1C. Again, as shown in FIG. 1D, in one embodiment, the available measurement image measurement locations include all fields 112 on the one or more wafers 104. Further, the available measurement image target locations include a sub-set of all the targets formed on one or more wafers in a lot of wafers. In another embodiment, the reference image measurement spots measured in a reference image sampling process may include a sub-set of the targets formed on one or more wafers in at least one lot.

It is further recognized herein that step 204 and step 206 need not be performed in the order described above. It is recognized herein that the reference image 120 may be formed following the acquisition of one or more measurement images 122. In this regard, the system may store acquired measurement images 122 and/or acquired reference images 120 in memory medium 108 and read in the needed imagery data when required for analysis.

In a fourth step 208, a virtual overlay of the one or more measurement images may be measured by comparing the one or more measurement images 122 acquired from the overlay target site 126 of the wafer 104 to the generated reference image 120. In this regard, a virtual overlay measurement may be calculated by comparing one aspect of the one or more measurement images 122 acquired from the overlay target site 126 of the wafer 104 to the generated reference image 120 of the virtual target 124.

In one embodiment, the virtual overlay of a measured overlay target 126 of the one or more measurement images may be determined by comparing a layer of the one or more measurement images 122 acquired from the overlay target site 126 of the wafer 104 to a corresponding layer of the generated reference image 120. In another embodiment, the virtual overlay of a measured overlay target 126 of the one or more measurement images may be determined by comparing a region of interest (ROI) 130 of the one or more measurement images 122 acquired from the overlay target site 126 of the wafer 104 to a corresponding ROI 128 of the generated reference image 120. In this regard, each ROI 130 measured in a measured target site 126 may be compared to the corresponding ROI 128 in the virtual target 124 of the reference image 120, rather than comparing the measured ROI 130 to its symmetry part. It is noted herein that this feature reduces possible error in the overlay measurement due to the decreased noise level generally obtainable in the reference image 120 (as compared to the measured image 122).

In one implementation of the method 200, the aggregated reference image 120 may be generated during a train process. In this regard, a sequence of reference image acquisitions may be carried out in order to collect reference measurement images from multiple wafer sites of the wafer 104. In turn, the system 100 may process the collected reference image measurements to generate a reference image 120. Further, the generated reference image 120 may be stored in memory medium 108 for later use. Then, a virtual overlay for the reference image 120 may be calculated and stored in memory 108. In addition, the ROIs of the measurement image 122 may be calculated and stored in memory 108. As such, during a process run, the overlay may be calculated by comparing new ROIs to older ROIs. In this manner, the relative displacement between various layers (e.g., inner/outer layers) are summed with the virtual overlay calculated during the train process.

In an additional step 210, overlay for the overlay target site 126 of the wafer 104 may be calculated utilizing the measured virtual overlay of the one or more measurement images 122. In this regard, the overlay may be calculated by summing the virtual overlay calculated in step 208 with the measured relative shifts between one or more portions of the target image and the reference image layers. In a further embodiment, the calculated overlay may be used to correct one or more lithography process in order to keep overlay errors within desired limits. In this regard, the overlay calculations provided in step 210 may be fed into an analysis routine suitable for calculating process correctables for the given process tool (e.g., stepper/scanner), which may be used by the operator in order to better align the process tool.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

What is claimed:

1. A method for performing reference-based overlay metrology using a virtual measurement image, comprising:
acquiring a plurality of reference measurement images from a plurality of reference overlay target sites of a wafer via a reference image sampling process, wherein the reference image sampling process includes acquiring one or more images at each of the plurality of reference overlay target sites of the wafer;
generating an aggregated overlay target reference image by combining the plurality of reference measurement images acquired from the plurality of reference overlay target sites of the wafer of the reference image sampling process;
acquiring one or more measurement images from an overlay target site of the wafer via a measurement image sampling process; and
measuring a virtual overlay of the one or more measurement images by comparing the one or more measurement images acquired from the overlay target site of the wafer to the generated aggregated overlay target reference image.

2. The method of claim 1, further comprising:
calculating overlay for the overlay target site of the wafer utilizing the measured virtual overlay of the one or more measurement images.

3. The method of claim 1, wherein a number of sampling locations is selectable by a user.

4. The method of claim 1, wherein a position of each sampling location is selectable by a user.

5. The method of claim 1, wherein a number of sampling locations is randomly generated.

6. The method of claim 1, wherein a position of each sampling location is randomly selected.

7. The method of claim 1, wherein the generating an aggregated overlay target reference image by combining the plurality of reference measurement images acquired from the plurality of reference overlay target sites of the wafer of the reference image sampling process comprises:
aligning the plurality of reference measurement images acquired from the plurality of reference overlay target sites of the wafer of the reference image sampling process; and
combining the aligned plurality of reference measurement images acquired from the plurality of reference overlay target sites of the wafer of the reference image sampling process.

8. The method of claim 1, wherein the generating an aggregated overlay target reference image by combining the plurality of reference measurement images acquired from the plurality of reference overlay target sites of the wafer of the reference image sampling process comprises:
generating an aggregated overlay target reference image by summing two or more of the reference measurement images acquired from two or more reference overlay target sites of the wafer of the reference image sampling process.

9. The method of claim 1, wherein the generating an aggregated overlay target reference image by combining the plurality of reference measurement images acquired from the plurality of reference overlay target sites of the wafer of the reference image sampling process comprises:
generating an aggregated overlay target reference image by averaging two or more of the reference measurement images acquired from two or more reference overlay target sites of the wafer of the reference image sampling process.

10. The method of claim 1, wherein the generating an aggregated overlay target reference image by combining the plurality of reference measurement images acquired from the plurality of reference overlay target sites of the wafer of the reference image sampling process comprises:
generating a virtual target in an aggregated overlay target reference image by combining the plurality of reference measurement images acquired from the plurality of reference overlay target sites of the wafer of the reference image sampling process.

11. The method of claim 1, wherein the measuring a virtual overlay of the one or more measurement images by comparing the one or more measurement images acquired from the overlay target site of the wafer to the generated aggregated overlay target reference image comprises:
measuring a virtual overlay of the one or more measurement images by comparing a layer of the one or more measurement images acquired from the overlay target site of the wafer to a corresponding layer of the generated aggregated overlay target reference image.

12. The method of claim 1, wherein the measuring a virtual overlay of the one or more measurement images by comparing the one or more measurement images acquired from the overlay target site of the wafer to the generated aggregated overlay target reference image comprises:
measuring a virtual overlay of the one or more measurement images by comparing a region of interest (ROI) of the one or more measurement images acquired from the overlay target site of the wafer to a corresponding ROI of the generated aggregated overlay target reference image.

13. A system for performing reference-based overlay metrology using a virtual measurement image, comprising:
one or more overlay metrology systems configured to acquire a plurality of reference measurement images from a plurality of reference overlay target sites of a wafer via a reference image sampling process, wherein the reference image sampling process includes acquiring one or more images at each of a plurality of reference overlay target sites of the wafer;
one or more computing systems including one or more processors;
a computer readable medium storing instructions executable by the one or more processors of the computing system and configured to cause the one or more processors to:
generate an aggregated overlay target reference image by combining the plurality of reference measurement images acquired from the plurality of reference overlay target sites of the wafer of the reference image sampling process;
acquire one or more measurement images from an overlay target site of the wafer via a measurement image sampling process; and
measure a virtual overlay of the one or more measurement images by comparing the one or more measurement images acquired from the overlay target site of the wafer to the generated aggregated overlay target reference image.

14. The system of claim 13, wherein the computer readable medium is further configured cause the one or more processors to:
calculate overlay for the overlay target site of the wafer utilizing the measured virtual overlay of the one or more measurement images.

15. The system of claim 13, wherein a number of sampling locations is selectable by a user.

16. The system of claim 13, wherein a position of each sampling location is selectable by a user.

17. The system of claim 13, wherein a number of sampling locations is randomly generated.

18. The system of claim 13, wherein a position of each sampling location is randomly selected.

19. The system of claim 13, wherein the generating an aggregated overlay target reference image by combining the plurality of reference measurement images acquired from the plurality of reference overlay target sites of the wafer of the reference image sampling process comprises:

aligning the plurality of reference measurement images acquired from the plurality of reference overlay target sites of the wafer of the reference image sampling process; and combining the aligned plurality of reference measurement images acquired from the plurality of reference overlay target sites of the wafer of the reference image sampling process.

20. The system of claim 13, wherein the generating an aggregated overlay target reference image by combining the plurality of reference measurement images acquired from the plurality of reference overlay target sites of the wafer of the reference image sampling process comprises:

generating an aggregated overlay target reference image by summing two or more of the reference measurement images acquired from two or more reference overlay target sites of the wafer of the reference image sampling process.

21. The system of claim 14, wherein the generating an aggregated overlay target reference image by combining the plurality of reference measurement images acquired from the plurality of reference overlay target sites of the wafer of the reference image sampling process comprises:

generating an aggregated overlay target reference image by averaging two or more of the reference measurement images acquired from two or more reference overlay target sites of the wafer of the reference image sampling process.

22. The system of claim 13, wherein the generating an aggregated overlay target reference image by combining the plurality of reference measurement images acquired from the plurality of reference overlay target sites of the wafer of the reference image sampling process comprises:

generating a virtual target in an aggregated overlay target reference image by combining the plurality of reference measurement images acquired from the plurality of reference overlay target sites of the wafer of the reference image sampling process.

23. The system of claim 13, wherein the measuring a virtual overlay of the one or more measurement images by comparing the one or more measurement images acquired from the overlay target site of the wafer to the generated aggregated overlay target reference image comprises:

measuring a virtual overlay of the one or more measurement images by comparing a layer of the one or more measurement images acquired from the overlay target site of the wafer to a corresponding layer of the generated aggregated overlay target reference image.

24. The system of claim 13, wherein the measuring a virtual overlay of the one or more measurement images by comparing the one or more measurement images acquired from the overlay target site of the wafer to the generated aggregated overlay target reference image comprises:

measuring a virtual overlay of the one or more measurement images by comparing a region of interest (ROI) of the one or more measurement images acquired from the overlay target site of the wafer to a corresponding ROI of the generated aggregated overlay target reference image.

\* \* \* \* \*